United States Patent

Harris

[15] 3,635,757

[45] Jan. 18, 1972

[54] EPITAXIAL DEPOSITION METHOD

[72] Inventor: Darrell M. Harris, Kirkwood, Mo.

[73] Assignee: Monsanto Company, St. Louis, Mo.

[22] Filed: Apr. 1, 1969

[21] Appl. No.: 841,167

Related U.S. Application Data

[62] Division of Ser. No. 475,722, July 29, 1965, Pat. No. 3,491,720.

[52] U.S. Cl. ....................117/201, 117/106

[51] Int. Cl. ....................H01b 1/06, H01l 7/36

[58] Field of Search ....................117/201, 106 A; 148/175; 118/48, 49.5

[56] References Cited

UNITED STATES PATENTS

| | | | |
|---|---|---|---|
| 3,206,322 | 9/1965 | Morgan | 118/48 |
| 3,314,393 | 4/1967 | Haneta | 118/48 |

FOREIGN PATENTS OR APPLICATIONS

| | | | |
|---|---|---|---|
| 724,799 | 2/1955 | Great Britain | 117/107.1 |

OTHER PUBLICATIONS

IBM Technical Bulletin Vol. 8, No. 5 Oct. 1965

*Primary Examiner*—William L. Jarvis
*Attorney*—John D. Upham and Joseph D. Kennedy

[57] ABSTRACT

A method for the epitaxial deposition of epitaxial coatings on a semiconductor member. The method comprises the supporting of semiconductor members on a bridge-type element and introducing the bridge element into a reactor housing having three chambers. The bridge is placed in a first chamber where a purging gas is introduced for purposes of purging the semiconductor member. The bridge is then placed in a second chamber which is isolated from the first chamber and a purging gas is introduced into the second chamber for further purging the semiconductor member. Finally, the bridge is passed into a third chamber which is isolated from the first and second chambers. Feed gases are introduced into the third chamber for causing an epitaxial coating material to be deposited on the semiconductor member. The bridge is then removed from the third chamber and through the first and second chambers to the atmosphere external to each of said chambers.

3 Claims, 6 Drawing Figures

INVENTOR
DARREL M. HARRIS

Robert J. Schaap

ATTORNEY

INVENTOR
DARREL M. HARRIS

Robert J. Schaap

ATTORNEY

EPITAXIAL DEPOSITION METHOD

This application is a division of my copending application Ser. No. 475,722, filed July 29, 1965, now U.S. Pat. No. 3,491,720.

This invention relates in general to certain new and useful improvements in epitaxial deposition systems, and more particularly, to an improved method for producing epitaxial deposition coatings on semiconductor bodies.

In recent years, semiconductor devices such as silicon controlled rectifiers have found widespread use in the electronics industry. Semiconductor devices which comprise a plurality of layers of semiconductor material having different conductivities and separated by a transition zone have proved to be very effective in many electronic devices. These semiconductor devices having at least two layers of different conductivities with a transition region therebetween are very suitable for use in the formation of electronic members such as diodes, transistors, switches and similar types of electronic structures.

One very effective method of producing semiconductor devices is by the expitaxial deposition of silicon on a wafer formed of like material. Generally, the wafers involved must be formed of a high-purity silicon, however, doped to a specified resistivity. These silicon wafers are then normally placed on an electrical resistance heating element which is secured to the electrical contacts of an epitaxial silicon furnace, and are heated to a temperature where free silicon is deposited on the wafer and becomes bonded to the surface of the wafer. One effective method of producing the free silicon which forms the epitaxial layer on the silicon wafers is by the reduction of gaseous trichlorosilane. These wafers are then further processed by conventional methods and used in the manufacture of the above solid-state devices.

In recent years, it has become a common practice to employ resistance heating elements formed of graphite in these epitaxial silicon furnaces. The heating elements are generally U-shaped in horizontal cross section and consist of a pair of legs which are connected by a bight portion. The legs are generally provided with terminal connectors at their free end, that is the ends remote from the bight portion for ultimate connection to the contacts of the deposition furnace. A suitable amount of electrical current is then passed through the heating element to heat the element to the desired reaction temperature. Generally, the heating element is enclosed within a bell jar, which is normally formed of a quartz or other high-silicon content material and which is preferably transparent. The bell jar or so-called "hat" is suitably secured to a base plate forming part of the furnace and also encloses the gas jets permitting entry of the gas into the bell jar.

It has been a common practice in the prior art to position these heating elements or so-called "bridges" in a substantially horizontal position so that the silicon wafers may be deposited directly upon the upper surface of the heating element. However, a horizontally disposed bridge has proved to be rather ineffective, particularly where it is desired to produce a large number of epitaxial silicon wafers in a single operation. It appeared as though the gas flow deposited the greater portion of the silicon on the wafers near the free end of the heating element. The gas jets of the silicon-bearing material and the reduction material, which was generally hydrogen entered beneath the bridge so that the gas would flow beneath the bridge around the free ends and over the upper portion thereof. During the reaction between the gases, the free silicon thus formed would then become deposited on the upper surface of the silicon wafer. However, much of the silicon contained within the feed gases was consumed and the wafers near the contact ends of the heating element received substantially lesser quantities of silicon layers. Moreover, it was difficult to maintain uniformity of thickness in the epitaxial layers in this type of operation.

Aside from the above problems, the heating elements were generally small in their construction by reason of the fact that they were almost always mounted in cantilever positions. Because of the fact that they were constructed of electrical resistance material, they were not inherently strong and consequently, the legs could not accommodate a large number of silicon wafers. Therefore, the wafers had to be very carefully placed on the legs of the heating element so that a maximum amount of bridge area was employed in each epitaxial deposition operation. Accordingly, a great deal of labor time was consumed in this operation, which materially increased the cost of each of the silicon wafers.

The bell jars employed in the prior art technique also created a number of problems which materially increased the labor time consumed in each operation and therefore materially increased the cost of silicon wafers produced. In the case where it is desired to produce deposition coatings on silicon wafers, a silicon-bearing feed gas is admitted to the reaction chamber. One common technique is to feed trichlorosilane and hydrogen to the reaction chamber thereby reacting the gases at high temperature and forms an elemental silicon deposit on the surface of the silicon wafers in the chamber. However, the residue products and the silicon-bearing gases have a tendency to react to form long chained silicon-bearing polymers where silicon forms part of the backbone of the polymer chain. This polymer tends to collect on the interior surface of the bell jar and adhere to the interior wall of the bell jar. This problem is primarily prevalent in stainless steel bell jars. This collection of a polymer on the wall of the bell jar produces no real problem during the epitaxial deposition operation. However, after the bell jar is substantially cooled and removed permitting access to the heating element, the interior surface of the jar is exposed to the atmosphere. The polymer by its very nature is very hydroscopic and hydrolyzes when exposed to moist air. The hydrolyzed polymer then becomes very tightly adherent to the interior wall of the bell jar and becomes very difficult to remove. Not only does the presence of the polymer produce an unsightly appearance, but it also has a tendency to break up into small particles which become deposited on the wafer surface and subsequently interfere with particles in succeeding epitaxial deposition reaction. Accordingly, it is necessary to remove this collected silicon-containing polymer from the interior surfaces of the bell jar after each deposition operation. This "down-time" is not only costly from the increased labor standpoint, but either prevents the use of the deposition furnace or the necessity of an inventory of a number of bell jars which can be employed.

Another problem often encountered with epitaxial deposition furnaces presently available is that much of the time employed in the operation for depositing epitaxial layers is consumed in preparatory processes. Generally, it is necessary to purge the atmosphere of the reaction chamber before admitting the feed gases in order to insure complete removal of any foreign matter. Furthermore, it is often necessary to even purge the heating element and the wafers contained thereon prior to the actual deposition of an epitaxial layer on the wafers. This type of process consumes a great deal of time in the epitaxial silicon furnace and also consumes a great deal of manual labor which is required to perform these purging operations.

It is, therefore, the primary object of the present invention to provide a method of producing epitaxial deposition layers on semiconductor material to produce a semiconductor body having at least two layers with a transition region therebetween.

It is another object of the present invention to provide a method of the type stated which is capable of producing epitaxial deposition layers on a plurality of wafers where each of the layers has a substantially uniform thickness.

It is a further object of the present invention to provide a method of the type stated which includes purging the heating element prior to the deposition operation in at least one chamber, and producing the epitaxial deposition coatings in another chamber.

It is yet another object of the present invention to provide a method of the type stated which is relatively inexpensive to perform and requires a minimum amount of manual labor time.

With the above and other objects in view, my invention resides in the novel features of form, construction, arrangement, and combination of parts presently described and pointed out.

In the accompanying drawings:

FIG. 1 is a vertical sectional view of an apparatus for producing semiconductor bodies which is constructed in accordance with and embodies the present invention;

FIGS. 2 and 3 are horizontal sectional views taken along lines 2—2 and 3—3, respectively, of FIG. 1;

GENERAL DESCRIPTION

Figure 1:
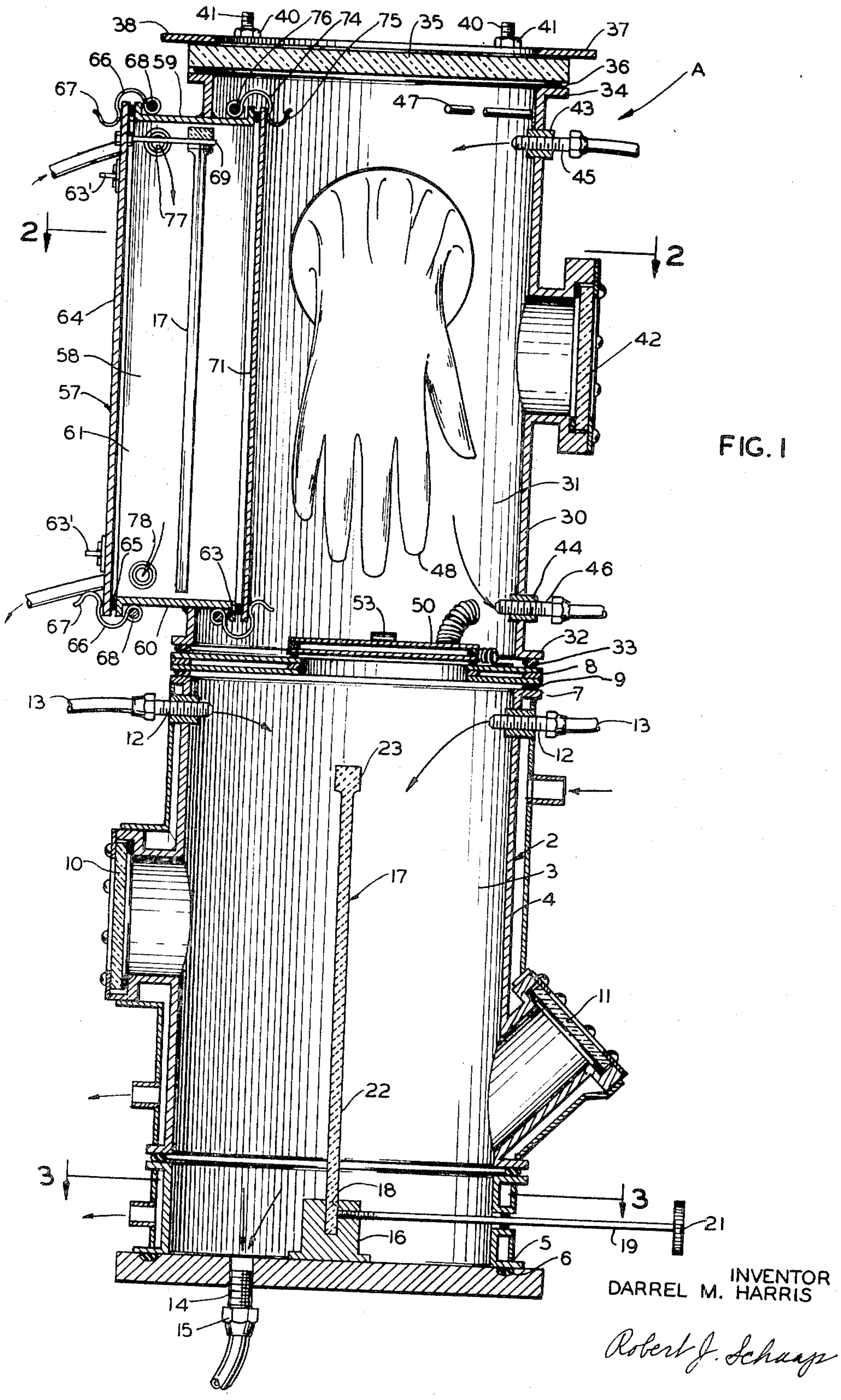

Generally speaking, the present invention relates to an apparatus and method for producing a plurality of uniform semiconductor bodies having a plurality of layers of semiconductor materials with different conductivities and where each of the layers is separated by a transition region. The various layers are of a single crystal structure and have different conductivities, either in type or in degree.

The present invention provides an apparatus which generally comprises a housing subdivided into three chambers. The lower chamber which is water cooled forms the reaction chamber and includes a pair of electrode clamps for holding a vertically disposed heating element. The heating element includes a number of wafer positions with means for holding the wafers while the heating element is disposed in the substantially vertical position. Moreover, the electrode clamps have externally extending handles for securing the heating element within the electrodes by means external to the reaction chamber. A pair of diametrally opposed gas jets are disposed along the upper margin of the reaction chamber and admit the feed gases in downwardly directed streams. Disposed above the reaction chamber is a second chamber which constitutes a purging chamber. A removable cover plate provides operative communication between the reaction chamber and the purging chamber. The purging chamber is also provided with gas inlets and gas outlets for admission and withdrawal of purging gases. Moreover, the second chamber is provided with a means for retaining another heating element which is ultimately to be disposed in the reaction chamber. Finally, a third chamber is provided with a removable closure plate providing operative communication to the second chamber. The third chamber is similarly provided with gas inlet and outlet ports for admission and withdrawal of purging gases. The third chamber is also provided with a removable closure plate for access to the third chamber and operative communication to the external atmosphere.

Thus, heating elements are operatively disposed in the first and second chambers and purging gas is admitted to each of these chambers. The atmosphere in each of the chambers is purged and the heating elements are cleansed during the time that feed gases are admitted to the reaction chamber for depositing epitaxial deposition layers on wafers which are, in turn, supported on a heating element in the reaction chamber. After a sufficient epitaxial layer has been deposited on the wafers in the reaction chamber, the heating elements are allowed to cool and the electrode clamps are released permitting removal of the heating element in the reaction chamber. Suitable hand gloves are provided for shifting the position of the heating elements in the reaction chamber is then shifted to the purging chamber and the heating element in the purging chamber is then shifted to the reaction chamber. Moreover, the heating element in the third chamber and the heating element which has just received the epitaxial coating are then changed in position where the heating element is ultimately removed to the atmosphere and the heating element which initially was disposed in the third chamber is then prepared for entry into the reaction chamber.

The heating elements which are provided for use in the present invention are designed so that each of the legs thereof is provided with sufficient area to accommodate at least one or two rows of wafers on each of the legs. Each of the rows is provided with a plurality of wafer positions where each wafer is secured to the heating element. By the use of pins which extend through the heating element or so-called "bridge," a plurality of wafers may be mounted on each flat surface of the legs, thereby substantially increasing the capacity of the heating elements.

The foregoing process may be employed in the formation of semiconductor bodies of known semiconductor material, the only criterion being that a decomposable vapor source of the material is available. The terms "thermally decomposable," "-termal decomposition," and "the associated deposit of a product of decomposition" as used herein are intended to be generic to the mechanism of the decomposition and reduction of various silicon-containing gases such as trichlorosilane and the liberation of silicon atoms through the action of reducing gases and heat on such silicon-bearing gases or mixtures thereof. These terms are also generic to and are included within the concept of the mechanism of high-temperature reactions where high temperature causes interaction between various materials with the liberation of specific materials or atoms.

DETAILED DESCRIPTION

Referring now in more detail and by reference characters to the drawings which illustrate a preferred embodiment of the present invention, A designates an apparatus for producing semiconductor bodies of substantial area and planarity having a plurality of layers of different conductivities with transition regions therebetween.

The apparatus A generally comprises a baseplate 1 upon which is mounted a segmented housing 2, substantially as shown in FIG. 1. The housing 2 is provided with a reaction chamber 3 formed by an annular sidewall 4, the latter being formed of stainless steel or similar metals which can be employed in the construction of the housing. Stainless steel is preferred because of its internal strength and because of the fact that it does not interfere with the reaction gases. Generally, stainless steel, such as Type 304 stainless steel is inert to feed gases such as trichlorosilane under the reaction conditions employed herein and, therefore, does not emit any impurities which may interfere with the reacting gases. The housing 2 is provided with a base flange 5 which is seated in facewise engagement with the upper surface of the baseplate 1 and provides an airtight seal through a sealing ring 6. The annular sidewall 4 is similarly provided with an annular top flange 7 which supports a top plate 8, the latter being held in fluidtight engagement by means of a sealing ring 9 interposed between the flange 7 and the plate 8. By reference to FIG. 1, it can be seen that the housing 2 is segmented so that it is adaptable to rapid assembly and disassembly for interchange of parts such as gas jets and sight glasses. The sidewall 4 is provided with a pair of conventional sight glasses or so-called "-sight tubes" 10, 11, the sight tube 11 being angularly disposed in the manner as illustrated in FIG. 1. By further reference to FIG. 1, it can be seen that the various components forming the reaction chamber 3 are double-walled or jacketed forming a cooling chamber for recirculating a cooling water. It can be seen that the major portion of the stainless steel surface exposed to the interior of the chamber 3 is jacketed. Furthermore, these various jacketed sections are provided with the conventional fluid inlet and outlet fittings for connection to a suitable source of coolant (not shown).

Operatively mounted in the upper end of the sidewall 4 are a pair of diametrally opposed gas jets 12 which are in turn connected to suitable sources of feed gases (not shown) by means of flexible tubes 13. The gas jets 12 are conventional in their construction and are, therefore, not described in detail herein. However, it should be understood that any suitable gas jet which is normally employed in epitaxial deposition furnaces is suitable for employment in the apparatus A. Similarly formed in the baseplate 1 is a discharge port 14 for removal of the spent or exhaust gases from the reaction chamber 3. It can be seen that the discharge port 14 is provided with a coupling 15 for removal of the spent gases and in turn communicates with the chamber 3. A suitable manually operable valve may be connected to the coupling 15 for regulating the amount of spent gases discharged from the chamber 3.

Rigidly mounted on the upper surface of the baseplate 1 and extending upwardly into the chamber 3 are a pair of chucks or so-called "clamps" 16 which serve as electrodes and to retain a suitable heating element 17, the latter to be hereinafter described in more detail. The chucks 16 are provided with aligned slots 18 for accommodating the lower ends of the heating element 17, in the manner as shown in FIG. 1 and moreover, can be tightened and released by means of actuating rods 19, which extend outwardly of the chamber 3 through an annular sealing ring 20. The actuating rod 19 can be suitably provided with a handle 21 for releasing the heating element 17 from the chuck 16. In this connection, it should be understood that any suitable mechanical type of grasping means can be used to retain and release the heating element within the slot 18 by means of the actuating rod 19. The chucks 16, which serve as electrodes, are conventionally provided with terminals (not shown) by which they are connected to a suitable source of electrical current (not shown) so that as current flows through the contacts and the chucks 16, it will flow through the heating elements 17 in order to raise the temperature thereof. It should be pointed out that it is often desirable to initially increase the temperatures of heating elements formed of silicon with a source of radiant energy since silicon has a high-negative resistance temperature coefficient, or in other words, a high resistance to the passage of electrical current, when cooled.

The heating element 17 is of the type described in my copending application Ser. No. 415,363 filed Dec. 2, 1964, now U.S. Pat. No. 3,351,742 and has a pair of vertically disposed legs 22, which are connected by a horizontally disposed bight portion 23. The bridge 17 is of the double-taper type where the legs are tapered from each of its transverse ends in such manner that they have a slightly smaller cross-sectional thickness at each of the ends than in the center portion thereof, when referring to the transverse dimension of the legs 22. Thus, it can be seen that the thicknesses of each of the legs increase as the distance from the free ends thereof increases. The angle of taper of each of the legs is so adjusted that a cross-sectional area of each of the legs 22 is maintained in order to provide a substantially constant uniform temperature distribution across each of the legs. The bight portion 23 is slightly thicker in the transverse dimension, reference being made to FIG. 1 than the overall thickness of the legs 22. For heaters having legs with an overall length of approximately 24 inches, the legs have an overall thickness of approximately 0.260 inch at the center portion and a thickness of approximately 0.215 inch at each of the ends. The bight portion 23 generally has an overall thickness of approximately 0.500 inch and a relative height of approximately 1⅝ inches. The heating element 17 is provided with a circular recess (not shown) at the point of connection of each of the two legs 22 with the bight portion 23 and serves to create a substantially uniform temperature distribution across the width of the bight portion 23. In essence, the recess forms a heat sink for heat dissipation in the region of high-current density. In this manner, it can be seen that relatively even resistance characteristics are maintained throughout each of the legs 22 and the bight portion 23 and, therefore, it is possible to maintain a substantially uniform temperature distribution across the lengths of each of the legs.

It is also possible to maintain uniform temperature characteristics throughout the lengths of each of the heater legs 22 by selectively altering the cross-sectional area in the manner also shown in my copending application Ser. No. 415,363, filed Dec. 2, 1964 now U.S. Pat. No. 3,351,742, dated Nov. 7, 1967. In this method, it is necessary to measure the temperature produced at various selected portions along the length and width of the heater legs. This can be conveniently accomplished by attaching thermalcouples to the heater and connecting the leads thereof to a suitable temperature readout device. An optical pyrometer may also be employed. After the temperature along the selected portions of the length of the heater legs has been recorded, the desired cross-sectional area can be obtained by removing the required amount of this cross-sectional area. This is conveniently accomplished by drilling small apertures which are sufficiently small so that they do not interfere with the internal strength of the heater, but yet are sufficient in number so that they sufficiently alter the cross-sectional area of the legs to provide proper resistance characteristics.

The material of construction of the bridges B is not necessarily limited to graphite, inasmuch as the bridges B can be prepared from any electrically conductive material of high resistance which exhibits a characteristic of becoming heated due to the passage of electrical current therethrough. The bridges may be of material such as silicon, or conducting ceramics such as silicon carbide, or graphite or refractory metals such as tantalum, molybdenum, or titanium. One important criterion is that the bridge must be made of a material which does not contain impurity atoms, or at least does not interact with the system by introduction of impurity atoms.

The bridge may also be surface treated in the manner described in my copending application Ser. No. 423,066, filed Jan. 4, 1965 now U.S. Pat. No. 3,406,044, dated Oct. 15, 1968. In this procedure, free silicon, which is produced by the reduction of gaseous trichlorosilane, is fused to the surface of the graphite heating element and reacts with the carbon atoms of the heating element to form a tightly adherent, substantially permanent, gas impervious film. The graphite heating element is heated to a temperature where a portion of the silicon reacts with the carbon of the heating element to form a silicon carbide film and the remainder of the silicon, which becomes liquified, penetrates into the pores of the graphite and becomes fused to the graphite. It has also been found possible to deposit a silicon carbide coating on the surface of the bridge which is prepared by the simultaneous reduction of trichlorosilane and chloroform. Here again, the silicon carbide becomes bonded to the surface of the graphite heating element. As a preferred embodiment, it has been found to be very acceptable to produce alternating layers of silicon and silicon carbide and deposit these layers on the surface of the heating element, all in the manner as more fully described in said copending application Ser. No. 423,066, filed Jan. 4, 1965 now U.S. Pat. No. 3,406,044.

Wafers $w$ of semiconductor material are prepared in any suitable manner, as for example, slicing or cutting wafers from commercially available zone-refined-single crystals of semiconductor material. Both of these methods are well known in the prior art. It is important that the wafers are cut in such a manner that the surface of the wafer to be treated is oriented in a specific crystallographic plane. Generally for the purposes of the present invention, it is preferred that the wafers are cut or sliced in such a manner so that they are oriented in a (1—1—1) plane on the Miller indices. Naturally, the surface of the wafer, which is to receive the epitaxial deposition film is carefully prepared by the generally accepted techniques of grinding, polishing, etching, and cleaning before the epitaxial deposition operation.

Figures 2, 3, 4, 5, 6:
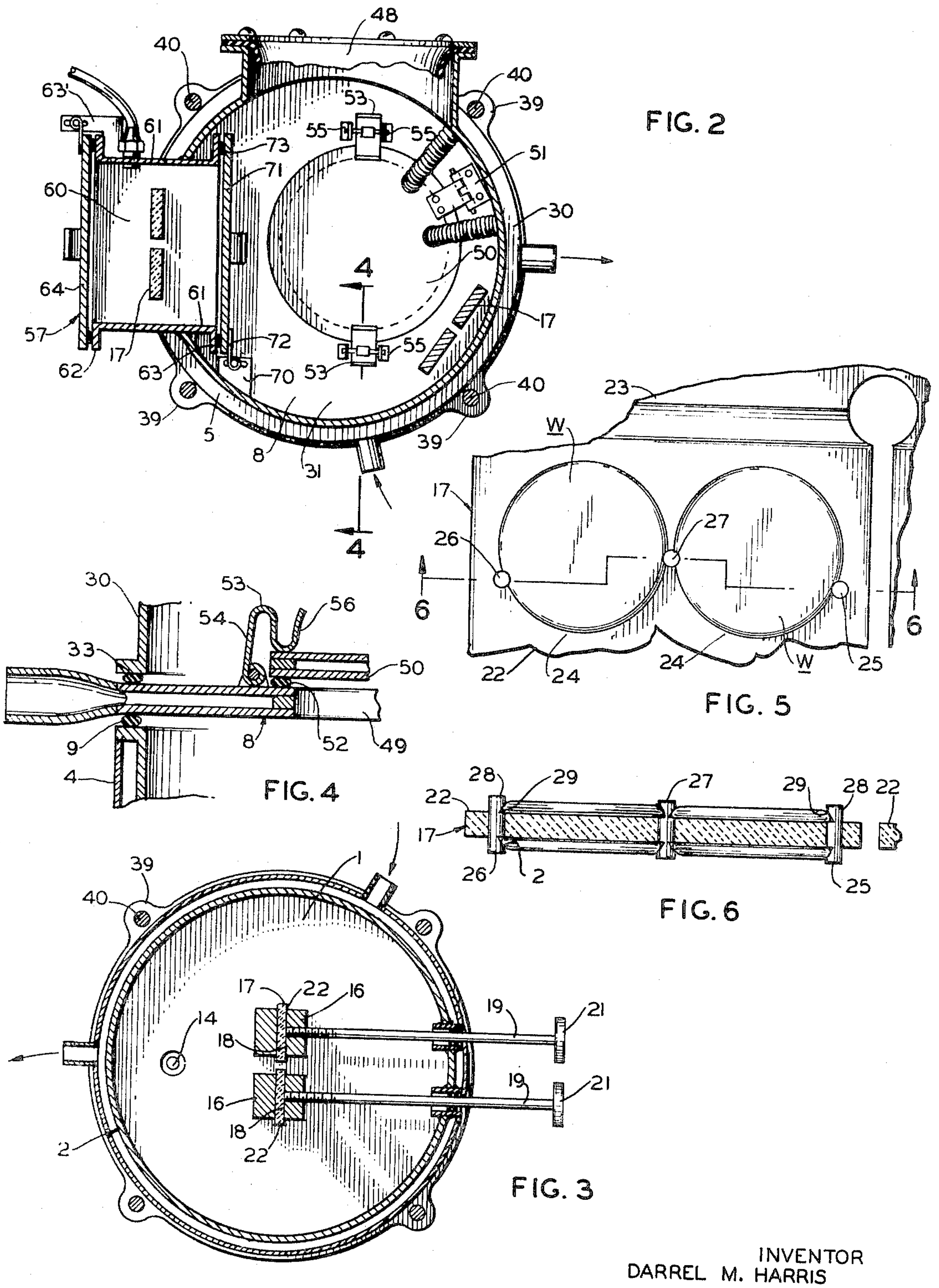
FIG. 4 is a fragmentary sectional view taken along line 4—4 of FIG. 2.
FIG. 5 is a fragmentary sectional view taken along line 5—5 of FIG. 1.
FIG. 6 is a fragmentary sectional view taken along line 6—6 of FIG. 1.

Each of the legs 22 is provided with two rows, each having a plurality of longitudinally spaced wafer positions 24 and which are located so that a wafer $w$ in one wafer position 24 is spaced a slight distance from another wafer $w$ located in the next adjacent wafer position 24 in the same row. In this manner, the maximum amount of the surface area of each leg of the bridge 17 is employed. Each side of the legs 22 is provided with marginally registered wafer positions. By reference to FIG. 5, it can be seen that the inner wafer positions 24 have an inner wafer pin 25 mounted slightly beneath the horizontal diameter of the wafer position and the outer wafer positions have pins 26 located slightly below the horizontal diameter of the wafer position. The pins 25, 26 are located along the periphery of the wafer positions 24 at an angle of about 20° to 30° below the horizontal centerline of the wafer position. The outer and inner wafer positions 24 share a common wafer supporting pin 27, which is located at the horizontal diameter of each of the wafer positions, substantially as shown in FIG. 5. The pin 27 is so located that the upper peripheral margin thereof is tangential to the horizontal centerline passing through the wafer position. Each of the pins 25, 26 is provided with extended ends 28 on each flat surface of the legs 22 and are provided with notches 29 on the transverse sides of the extended ends for engaging the peripheral margins of wafers *w* retained therein. The construction of the pins 25, 26 is more fully described in my copending application Ser. No. 475,106, filed July 27, 1965, now U.S. Pat. No. 3,391,270, dated July 2, 1968. Similarly, the center pin 27 is provided with notches on each transverse and for engaging both of the wafers *w* in each of the horizontally aligned wafer positions 24. The pin 27 is similarly described in the aforementioned copending application.

It is desirable to locate each of the pins 25, 26 and 27 as close to the horizontal diameter of each of the wafer positions as possible. However, the pins 25, 26 must be located within the range of about 20° to 30° below the horizontal diameter in order to provide proper support. However, the center pin 27, which is common to both wafer positions 24 can be placed approximately at the horizontal diameter of the wafer position inasmuch as each wafer position has one outer pin 25, 26 located slightly below the horizontal diameter thereof. It is desirable to locate each of the respective pins at the horizontal diameter in order to eliminate any possibility of interference with gas flow. However inasmuch as the extended ends of the pins are relatively short with regard to the overall thickness of the wafer *w*, the interference with the gas flow is very small. Moreover, these portions of the wafers immediately adjacent to the pins are generally removed in further processing operations where the wafer is employed to construct a semiconductor device.

It should be appreciated that by following the teachings of this invention, it is possible to form semiconductor bodies having a plurality of layers of differing conductivities. Moreover, the width of each of the layers may be precisely controlled by generally accepted techniques. This allows the transition region or junction to be accurately positioned in the semiconductor body. Moreover, it is also possible to provide, in any layer formed, any variation in conductivity desired in a plane which is parallel to the transition region by varying the concentration of vapor source of the active impurity atoms in the flow.

An annular sidewall 30 having a substantially cylindrical horizontal cross section is disposed around the upper surface of the plate 8 and forms a purging chamber 31. The sidewall 30 is provided with an outwardly flaring annular base flange 32 which is designed to engage the upper surface of the plate 8 and is sealed with respect thereto by means of an annular sealing ring 33. The sidewall 30 is also formed of the same material used in the construction of the sidewall 4 and preferably is stainless steel. The annular sidewall 30 is integrally formed with an outwardly flaring annular top flange 34 and disposed thereon is a relatively thick circular viewing panel 35, which is sealed to the flange 34 by means of an annular sealing ring 36. The panel 35 may be formed of any suitable transparent material such as glass, quartz, or any synthetic material such as a polymethylmethacrylate or polymethylacrylate. Moreover, on its upper surface the panel 35 has an annular recess for accommodating an annular metal retaining ring 37, which is provided with a plurality of annularly spaced outwardly extending lobes 38. The lobes 38 are designed to match outwardly extending lobes 39 on the baseplate 1 and each is centrally apertured to accommodate bolts 40, which are provided at their upper ends with nuts 41. In this manner, the two sections of the housing which consist of the sidewalls 4 and 30 may be removably secured in a gastight unitary structure through the bolts 40. Moreover, the housing is easily disassembled by removing the nuts 41 from the bolts 40 and removing the various sidewalls 30.

The sidewall 30 is similarly provided with a conventional sight glass 42 which is similar to the previously described sight glass 10, and is designed to permit viewing of the chamber 31. Moreover, the sidewall 30 is suitably apertured and provided with the necessary supporting rings 43, 44 to accommodate a gas inlet jet 45 and a discharge tube 46, respectively. The inlet jet 45 is connected to some suitable source of purging gas such as nitrogen or hydrogen (not shown) for purging the atmosphere of the chamber 31. The discharge tube 46 is suitably connected to some means for removing the spent gases from the chamber 31. For optimum design, it is preferable to have the inlet jet 45 located near the upper end of the sidewall 30 and the discharge tube 45 located near the lower end thereof, substantially as shown in FIG. 1. The interior surface of the sidewall 30 is provided with one or more hooks 47 for retaining heating elements similar to the heating element 17. Moreover, the sidewall 30 is suitably apertured to accommodate a conventional hand glove 48. The hand glove may be formed of a neoprene rubber or similar inert material which will not interfere with the purging gases admitted to the chamber 31. Moreover, the hand glove 48 must be formed of a material which will not contribute to any impurities in the atmosphere of the chamber 31 or which will create any impure condition on the surface of the heating element 17. The hand glove 48 may be suitably mounted in the sidewall 30 in any conventional manner, such as by means of an annular retaining ring provided with proper seals. The method of securing the hand glove 48 to the sidewall 30 is conventional in its construction, and is, therefore, neither illustrated nor described in detail herein. It should be pointed out in this connection, however, that the hand glove must be formed of a fairly thick rubber material which is capable of withstanding reduced pressures without expanding inasmuch as the chamber 31 can be subjected to reduced pressures if desired. Furthermore, the annular retaining ring may be annularly provided with a flange for accommodating a removable cover plate (not shown) if desired, when the chamber 31 is evacuated.

Communication is provided between the reaction chamber 3 and the purging chamber 31 through an aperture 49 formed within the plate 8 and a removable cover plate 50 is disposed thereover in the manner as shown in FIGS. 1 and 2. The cover plate 50 is secured to a conventional hinge 51 which is, in turn, secured to the top plate 8. The cover plate 50 and the top plate 8 are both jacketed and the top plate 8 is provided with fittings for connection to the source of coolant (not shown). The coolant chamber in the top plate 8 is connected to the coolant chamber of the cover plate 50 through flexible bellows substantially as illustrated in FIGS. 1 and 2.

The cover plate 50 is provided on its underface with an annular sealing ring 52, which engages the upper surface of the plate 8 so that when the cover plate 50 is in its closed position, that is the position as shown in FIG. 1, a gastight seal will be maintained between the reaction chamber 3 and the purging chamber 31. The sealing ring 52 can be formed of a neoprene rubber or similar inert material which is capable of creating an airtight seal between the two chambers and is also capable of withstanding corrosion or deleterious effects from any of the gases in the two chambers. It should also be understood that the sealing ring 52 could be a sealing contact strip which is disposed on the undersurface of the plate 50 or alternatively on the upper surface of the top plate 8 so that a gastight seal is maintained between the cover plate 50 and the top plate 8 when the former is moved to its closed position. The cover plate 50 is retained in a closed position by means of a pair of spring clamps 53, which are more fully illustrated in FIG. 4.

The spring clamps 53 are pivoted on pivot pins 54, which are, in turn, retained on the upper surface of the plate 8 by means of retaining brackets 55. The spring clamps 53 consist of resilient arms 56, which engage the upper surface of the cover plate 50, in the manner as shown in FIGS. 2 and 4.

The annular sidewall 30 is cut away to accommodate a holding chamber cabinet 57, the interior of which forms a holding chamber 58. The holding cabinet 57 comprises top and bottom plates 59, 60 which are welded or otherwise rigidly secured to the cutaway margins of the sidewall 30, in the manner as shown in FIG. 1. The anulus of the cutaway portion of the wall 30 may similarly be formed with gusset-type plates or flanges for reinforcement of the top and bottom plates 59, 60. Welded or otherwise rigidly secured to the plates 59, 60 are sidewalls 61, which form part of the cabinet 57. The sidewalls 61 are provided at each of its transverse ends with outwardly extending door engaging flanges 62, 62'. Welded or otherwise rigidly secured to one of the sidewalls 61 are a pair of vertically spaced brackets 63 for hingedly retaining a door 64. By reference to FIG. 2, it can be seen that the door is pivotal with respect to the flanges 62, 62', and is sealed thereagainst by means of an annular sealing ring 65, which may be mounted on the interior surface of the door 64 or upon the exterior surface of the flanges 62, 62' as desired. The door 64 is held in its closurewise position by means of a pair of upper and lower spring clamps 66, which are substantially identical to the previously described spring clamps 53, and consist of a resilient arm 67, secured to pivot pins 68, which are in turn mounted on the upper and lower surfaces of the top and bottom plates 59, 60 respectively. The door 64, which provided access to the interior of the holding chamber 58 is provided with one or more inwardly extending hooks 69 for retaining heating elements similar to the heating element 17.

The interior surface of the annular sidewall 30 is provided with a pair of vertically spaced brackets 70 in the area of the flanges 62, 62' for accommodating an interior door 71, which is designed to close communication between the purging chamber 31 and the holding chamber 58. The door 71 is similarly mounted on conventional hinges 72, which are, in turn, secured to the brackets 70 and may be opened or closed as desired. The door 71 is similarly provided with a somewhat rectangular sealing ring 73 along its peripheral margins and which abuts against the interior flanges 62, 62' when the door 71 is shifted to its closed position, that is the position as shown in FIG. 2. It should be understood in this connection that the sealing ring 73 could be mounted on the flanges 62, 62' and designed to abut against the door 71, when the latter is shifted to its closed position. A pair of upper and lower clamps 74 are also provided for holding the door 71 in its closed position. The clamps 74 are similar to the previously described clamps 66 and comprise fairly resilient arcuate arms 75 which are pivotally mounted on the top and bottom plates 59, 60 by means of pivot pins 76.

By further reference to FIG. 1, it can be seen that the holding chamber 58 can also be employed as a purging chamber and is, therefore, provided with a gas inlet jet 77, which is connected to a suitable source of purging gas (not shown). The chamber 58 is also provided with a discharge port 78, which is, in turn, suitably connected to a means for accumulating the exhaust gases.

While the apparatus A generally illustrates a low-pressure operating device, it should be understood that the same could be modified with very simple modifications so that the same is adaptable for high-pressure operations. For example, the hand glove 48 could be constructed of a fairly heavy rubber material, which will not yield during high-pressure operations, or the same could be replaced by a suitable rod actuating mechanism (not shown). A cover plate (not shown) could also be employed to cover the aperture leading to the hand glove 48 as described above. Moreover, the various clamps, such as the clamps 66, 74 could be replaced by a suitable wing nut system where the various doors are retained in the closurewise position, and moreover in a pressure-holding position.

OPERATION

In use, the apparatus A may be easily assembled and disassembled by means of the bolts 40 and the nuts 41. By removing the nuts 41 from the bolts 40, the various sections of the apparatus A can be disassembled and replaced when necessary. This segmented type of construction provides increased utility.

In actual operation, a heating element or so-called "bridge" would be disposed in each of the chambers 3, 31 and 58. For the purposes of illustrating the present invention, it may be assumed that a bridge 17 is disposed within each of the chambers and that a bridge loaded with silicon wafers has been secured to the electrode clamp 16 in the reaction chamber 3. Furthermore, a bridge 17 is disposed on the hook 47 in the purging chamber 31 and a bridge 17 is disposed on the hook 69 in the reaction chamber 58. At the start of the cycle, the cover plate 50 which is disposed in closurewise position over the aperture 49 is opened thereby providing communication between the reaction chamber 3 and the purging chamber 31. The heating element 17 is lowered by means of the hand glove 48 into the slot 18 and secured therein by means of the actuating rod 19 through the handle 21. The operation can be observed through the sight glasses 10 or 11. Thereafter, the cover plate 50 is closed and locked by means of the clamps 53.

Thereafter, feed gases are admitted to the reaction chamber 3 by means of the gas jets 12. Dry nitrogen at the rate of approximately 50 liters per minute is admitted to the reaction chamber 3 for approximately 5 minutes in order to purge the atmosphere thereof. Thereafter, hydrogen is admitted to the reaction chamber 3 at the rate of approximately 75 liters per minute for approximately 5 minutes in order to rid the chamber of any nitrogen content. Naturally, the nitrogen and hydrogen gases must be pure in order to prevent any contamination of wafers disposed on the heating element 17. It has been found in connection with the present invention that the original purging operation in the chamber 3 can be eliminated with no serious contamination effects, due to the fact that the chamber 3 is only in communication with the chamber 31. Current is thereafter applied to the heating element 17 through the clamps 16 so that the heating element is raised to a temperature of at least 1,170° C. After the heating element has reached its equilibrium temperature conditions, the feed and dopant gases are then admitted to the chamber through the jets 12. The jets 12 are suitably connected to a multiple position valve which permits entry of the desired gas, such as the hydrogen, nitrogen or any of the feed gases which are to be admitted. This type of construction is conventional and is, therefore, neither illustrated nor described in detail herein. It is to be noted that the gases which enter through the jets 12 will follow somewhat of a circular path within the reaction chamber whereby the gases will flow downwardly and in close proximity to the surfaces of the heating element 17 on which the wafers are disposed and upward along the interior surfaces of the sidewall 4. In this manner, the gases provide somewhat of a circular movement on each side of the heating element 17. Some of the gases, of course, are withdrawn through the discharge port 14 in order to maintain somewhat of an equilibrium pressure or desired pressure within the reaction chamber 3. A valve, of course, can be provided on the discharge port 14 for regulating the amount of exhaust gas which is to be withdrawn from the reaction chamber 3. It has been found that by locating the gas jets along the upper surface of the reaction chamber 3, much improved results are obtained. It was found that when the gas jets were located near the base of the reaction chamber 3, complete gas cycles of the type herein described were not obtained. Moreover, it has been found that by employing two gas jets a much more uniform and satisfactory surface coating is produced on each of the wafers supported on the heating element 17.

For further purposes of illustrating the present invention, it may be assumed that the wafers disposed on the heating element 17 are formed of silicon and that the coating to be epitaxially deposited on the wafer *w* is again an epitaxial silicon coating. In this case, one of the feed gases would be a silicon-bearing gas. Generally preferred is trichlorosilane for use in producing an epitaxial silicon coating. The gaseous trichlorosilane is admitted to the reaction chamber 3 at a rate of approximately 4 grams per minute for a period of about 20 minutes to obtain a generally desired film thickness. The time for feeding the silicon bearing gas is determined by the thickness of the epitaxial coating desired. Trichlorosilane reacts with the hydrogen to form hydrogen chloride and free silicon, the latter of which is deposited on the surface of the wafers. Simultaneously with the admission of the feed gas, a dopant can also be added in order to obtain the desired epitaxial coating characteristics. For example, if it is desired to obtain an N-epitaxial layer, then phosphine or arsine may be added to the feed gas. If, however, it is desired to obtain a P-type of epitaxial coating, then a dopant such as diborane may be added to the feed gas.

After the desired thickness of coating has been deposited on the wafer supported on the heating element 17, the trichlorosilane feed gas and dopant gas is discontinued. However, the hydrogen feed gas is maintained but the temperature of the bridge is maintained at the 1,170° temperature in order to prevent contamination from the remaining quantities of feed gas in the reaction chamber 3. The hydrogen will react with the remaining quantities of feed gas thereby removing all free silicon or gases which are capable of producing free silicon from the atmosphere. Thereafter, electrical current to the heating element 17 is discontinued permitting the bridge to cool. However, hydrogen feed is still maintained in order to aid in the cooling of the heating element 17. The hydrogen purging is continued for approximately 10 minutes after the power to the heating element 17 is discontinued. Thereafter in order to purge the atmosphere in the chamber 3, nitrogen is admitted for approximately 5 minutes.

While the epitaxial deposition process is carried on in the reaction chamber 3, the purging chamber 31 is continually purged with nitrogen. Accordingly, when the heating element 17 is removed from the chamber 3, the atmosphere in the purging chamber 31 will not provide any contaminating atmosphere in the reaction chamber 3.

When it is desired to change the two heating elements 17 in the reaction chamber 3 and the purging chamber 31, the actuating rod 19 is turned, in order to release the heating element 17 and the clamps 16. The clamps 53 are opened permitting the cover plate 50 to be swung to its open position. Thereafter, a hand inserted in the hand glove 48 can be extended into the reaction chamber 3 for grasping the heating element 17 by the bight portion 23 and pulling the same upwardly into the purging chamber 31. The heating element 17 can be hung on any suitable hook 47 within the purging chamber 31. Then, the heating element 17 which was disposed in the purging chamber 31 can be moved into the reaction chamber 3 and shifted into the slot 18 where it is retained by turning the rod 19 to lock the heating element 17 in the clamp 16. Thereafter, the door 50 can be closed and held in the closed position by means of the clamps 53. At this point, the door 71 can be opened permitting communication between the chamber 31 and the holding chamber 58. A heating element which was originally disposed in the chamber 58 is then shifted into the purging chamber 31. The heating element which has just received the epitaxial coating can then be shifted into the holding chamber 58. Thereafter, the door 71 is closed and retained in the closed position by means of the clamps 74. While in the purging chamber, both the heating element and the chamber will be continually purged by nitrogen gas which is continually admitted to the chamber 31. In order to remove the heating element which was removed from the reaction chamber 3, the door 64 is opened by releasing the clamps 66. Thereafter, this latter named heating element can be removed and the wafers removed form the heating element. A new heating element 17 is then disposed on the hook 69 and the door 64 shifted to the closed position. It can be seen that as this occurs, the holding chamber 58 will be exposed to the atmosphere and thereby pick up contaminates from the atmosphere. However, the continual purging of the holding chamber 58 with nitrogen rapidly cleanses the atmosphere therein so that when the door 71 is opened, the chamber 31 does not receive any contaminates. Moreover, as an extra precaution, the chamber 31 prevents any contaminates from entering the reaction chamber 3. Consequently, it can be seen that the reaction chamber 3 is almost permanently sealed from atmospheric conditions.

Moreover, it can also be seen that by purging the holding chamber 31 and the holding chamber 58, not only is the atmosphere cleansed so that contaminates will enter through the chamber 3, but the heating elements themselves are also cleansed. In this manner, the original purging time normally required in epitaxial deposition furnaces has been substantially reduced and consequently, more efficient operating time can be obtained in the reaction chamber 3. Furthermore, as pointed out above, the purging operation in the reaction chamber 3 can be eliminated if desired without any serious consequence of contamination. It can also be seen that this cycle is continually maintained. After the wafers on the heating element 17 in the reaction chamber 3 have received a sufficient epitaxial deposition coating, the heating element 17 is then removed into the purging chamber 31 in the manner previously described. Similarly, the heating element in the purging chamber 31 is then shifted into the reaction chamber 3. The same shift thereafter takes place between the holding chamber 58 and the purging chamber 31.

It should be appreciated that by following the teachings of this invention, it is possible to form semiconductor bodies having a plurality of layers of differing conductivities. Moreover, the width of each of the layers may be precisely controlled by generally accepted techniques. This allows the transition region or junction to be accurately positioned in the semiconductor body. Moreover, it is also possible to provide in any layer formed, any variation in conductivity desired in a plane which is parallel to the transition region by varying the concentration of vapor source of the active impurity atoms in the flow.

It can also be seen that any desired type of semiconductor device may be made by utilizing the methods and the apparatus of the present invention. In each case, the semiconductor device will have at least two layers of semiconductor material with different conductivities and each of the layers being separated by a transition region. In some instances, the transition region will be a PN-junction, where in other cases, it may be a PI- or an NI-junction. In some cases as desired, there may be a sharp transition region between layers of high- and low-resistivity material of the same conductivity type. It should also be appreciated that the invention may be employed in the formation of semiconductor bodies having a plurality of layers of semiconductor material of differing conductivities separated by a transition region. It should be understood that each of the layers may be the same semiconductor material and other than silicon, for example, silicon carbide, various group 3–5 compounds, such as gallium arsenide, indium antimonide, gallium phosphide, and similar types of material. Naturally, the individual layers of these latter groups of compounds may be formed of different semiconductor materials. It is, however, that essentially single crystal growth is maintained and hence, strong consideration must be given when depositing layers of dissimilar material to the crystallography of the layer on which the growth occurs in order to preserve the single crystal characteristics to the greatest degree possible.

It should be understood that changes and modifications in the form, construction, arrangement and combination of parts presently described and pointed out may be made and substituted for those herein shown without departing from the nature and principle of my invention.

Having thus described my invention, what I desire to claim and secure by Letters Patent is:

1. the method of depositing an epitaxial coating on a semiconductor member, said method comprising supporting the semiconductor member on a supportive structure, introducing said supportive structure into a first chamber, introducing a purging gas into said first chamber for purging said semiconductor member, passing said supportive structure directly into a second chamber substantially isolated from said first chamber without bringing said supportive structure into contact with any foreign atmosphere, introducing a purging gas into said second chamber for further purging said semiconductor member, passing said supportive structure into a third chamber substantially isolated from said first and second chambers without substantially contaminating said third chamber, introducing feed gases into said third chamber for causing an epitaxial coating material to be produced and deposited on said semiconductor member, and removing said supportive structure directly through said second chamber without substantially isolating said third chamber and through said first chamber to an atmosphere external to any of said chambers.

2. The method of claim 1 further characterized in that a purging gas is introduced into said third chamber for purging the atmosphere thereof after said supportive structure has been passed into said third chamber.

3. The method of claim 1 further characterized in that a purging gas is again introduced into said first chamber prior to removing said supportive structure and semiconductor member from said first chamber.

* * * * *